(12) United States Patent
Lin et al.

(10) Patent No.: US 8,405,143 B2
(45) Date of Patent: Mar. 26, 2013

(54) SEMICONDUCTOR DEVICE

(75) Inventors: Chun-Hsien Lin, Tainan County (TW); Chao-Ching Hsieh, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 2 days.

(21) Appl. No.: 13/031,910

(22) Filed: Feb. 22, 2011

(65) Prior Publication Data

US 2011/0140206 A1    Jun. 16, 2011

Related U.S. Application Data

(63) Continuation-in-part of application No. 12/509,623, filed on Jul. 27, 2009, now Pat. No. 7,915,127.

(51) Int. Cl.
*H01L 29/792* (2006.01)

(52) U.S. Cl. ........ 257/326; 257/200; 257/266; 257/324; 257/325; 257/365

(58) Field of Classification Search .................. None
See application file for complete search history.

(56) References Cited

U.S. PATENT DOCUMENTS

| | | | |
|---|---|---|---|
| 6,458,684 B1 | 10/2002 | Guo et al. | |
| 2007/0132054 A1* | 6/2007 | Arghavani et al. | 257/506 |
| 2007/0272916 A1* | 11/2007 | Wang et al. | 257/24 |
| 2008/0014688 A1* | 1/2008 | Thean et al. | 438/197 |
| 2008/0224235 A1* | 9/2008 | Lavoie et al. | 257/407 |
| 2009/0159962 A1* | 6/2009 | Kim et al. | 257/326 |

\* cited by examiner

*Primary Examiner* — Kyoung Lee
(74) *Attorney, Agent, or Firm* — J.C. Patents

(57) ABSTRACT

A semiconductor device including a substrate, a gate structure, a spacer and source/drain regions is provided. The gate structure is on the substrate, wherein the gate structure includes, from bottom to top, a high-k layer, a work function metal layer, a wetting layer and a metal layer. The spacer is on a sidewall of the gate structure. The source/drain regions are in the substrate beside the gate structure.

19 Claims, 6 Drawing Sheets

SEMICONDUCTOR DEVICE

CROSS-REFERENCE TO RELATED APPLICATION

This application is a continuation-in-part application of, and claims priority benefits of U.S. patent application Ser. No. 12/509,623, filed on Jul. 27, 2009, now pending. The entirety of the above-mentioned patent application is hereby incorporated by reference herein and made a part of this specification.

BACKGROUND OF THE INVENTION

1. Field of Invention

The present invention relates to a semiconductor device, and more particularly to a semiconductor device having a void-free metal gate.

2. Description of Related Art

As the dimension of a semiconductor device is getting smaller, the dimension of the gate structure and the thickness of the gate insulation layer are reduced accordingly. However, a leakage current occurs when the gate insulation layer of silicon oxide becomes thinner. To reduce the leakage current, a high dielectric constant (high-k) material is used to replace silicon oxide for forming the gate insulation layer. The gate of polysilicon may react with the high-k material to generate a Fermi-level pinning, so that the threshold voltage is increased and the performance of the device is affected. Therefore, a metal layer (i.e. so-called work function metal layer) is used as a gate, so as to avoid an increase in the threshold voltage and reduce the resistance of the device.

One known method of forming a metal gate is described below. First, a high-k material layer, a work function metal material layer and a polysilicon material layer are sequentially formed on a substrate. Thereafter, the above-mentioned layers are patterned to form a gate structure including, from bottom to top, a high-k layer, a work function metal layer and a polysilicon layer. Due to the limitation of the etching process during the patterning step, the gate structure is usually shaped as a trapezoid with a bottom wider than a top, and the sidewall thereof and the substrate form an inner included angle of 88 to 89 degrees. Afterwards, a spacer is formed on the sidewall of the gate structure. Source/drain regions are then formed in the substrate beside the gate structure. Further, an interlayer dielectric (ILD) layer is formed over the substrate, and the ILD layer is planarized to expose the surface of the gate structure. Thereafter, the polysilicon layer of the gate structure is removed, and a metal layer is filled in the exposed trench of the gate structure. However, since the gate structure is shaped as a trapezoid with a bottom wider than a top, when the metal layer is filled in the exposed trench of the gate structure by a sputtering process, poor metal gap fill issue is caused, voids are formed, and the reliability and performance of the device are accordingly affected.

SUMMARY OF THE INVENTION

Accordingly, the present invention provides a semiconductor device having a void-free metal gate so as to enhance the reliability and performance of the device.

The present invention provides a semiconductor device including a substrate, a gate structure, a spacer and source/drain regions. The gate structure is on the substrate, wherein the gate structure includes, from bottom to top, a high-k layer, a work function metal layer, a wetting layer and a metal layer. The spacer is on a sidewall of the gate structure. The source/drain regions are in the substrate beside the gate structure.

According to an embodiment of the present invention, the gate structure further includes an insulation layer formed between the substrate and the high-k layer.

According to an embodiment of the present invention, the metal layer includes Al, for example.

According to an embodiment of the present invention, the metal layer is selected from the group consisting of TiN, Ti, Ta, TaN, TiC, TaC, TiAl, W, WN, Co, Cu, Ni and combinations thereof, for example.

According to an embodiment of the present invention, the metal layer is a bi-layer structure including a AlTi layer and a AlTiO layer, for example.

According to an embodiment of the present invention, the AlTi layer is under the AlTiO layer.

According to an embodiment of the present invention, an Al/Ti ratio in the AlTi layer is about 65:35 atom %, for example.

According to an embodiment of the present invention, an Al/Ti/O ratio in the AlTiO layer is about 40:10:50 atom %, for example.

According to an embodiment of the present invention, the wetting layer includes Ti, $TiAl_x$, Ti rich TiN, Al or a combination thereof, for example.

According to an embodiment of the present invention, the wetting layer is formed by a physical vapor deposition (PVD) process, for example.

According to an embodiment of the present invention, the work function metal layer includes TiN, TaC, TaCNO, TaCN, $TiAl_x$ or TaN, for example.

According to an embodiment of the present invention, the gate structure further includes a middle layer formed between the work function metal layer and the wetting layer.

According to an embodiment of the present invention, the middle layer and the work function metal layer include different materials.

According to an embodiment of the present invention, the middle layer includes Ti rich TiN or Ti rich $TiAl_x$, for example.

According to an embodiment of the present invention, the middle layer is for adjusting a work function value of the work function metal layer.

According to an embodiment of the present invention, the high-k layer includes $HfO_2$, $ZrO_2$, $Al_2O_3$, AlN, $TiO_2$, $La_2O_3$, $Y_2O_3$, $Gd_2O_3$, $Ta_2O_5$ or a combination thereof, for example.

According to an embodiment of the present invention, the semiconductor device further includes a stress layer on a sidewall of the spacer.

According to an embodiment of the present invention, the stress layer includes silicon nitride, for example.

According to an embodiment of the present invention, the source/drain regions are doped regions.

According to an embodiment of the present invention, the source/drain regions are epitaxial layers.

In view of the above, in the semiconductor device of the present invention, a wetting layer is disposed below a metal layer, so that the metal layer can grow as a void-free metal layer. Therefore, the reliability and performance of the device are accordingly enhanced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1E' schematically illustrates, in a cross-sectional view, a semiconductor device according to an embodiment of the present invention.

DESCRIPTION OF EMBODIMENTS

FIGS. 1A to 1E schematically illustrate, in a cross-sectional view, a method of forming a semiconductor device according to an embodiment of the present invention.

Figure 1A:
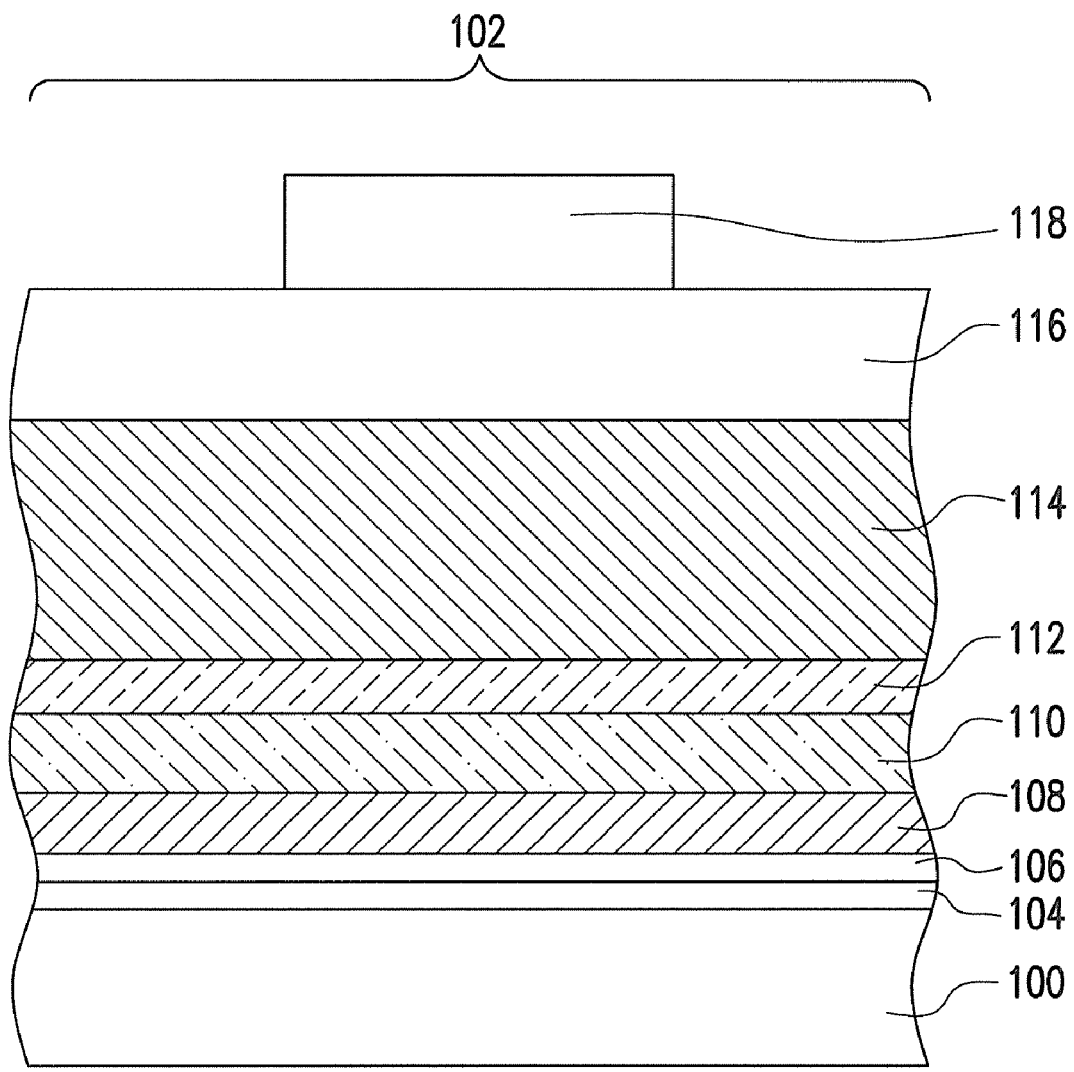
FIGS. 1A to 1E schematically illustrate, in a cross-sectional view, a method of forming a semiconductor device according to an embodiment of the present invention.

Referring to FIG. 1A, a substrate 100 is provided. The substrate 100 has a first area 102. The substrate 100 is a silicon substrate, for example. Thereafter, a high-k material layer 106 is formed on the substrate. The high-k material layer 106 includes a material with a dielectric constant greater than 4, such as $HfO_2$, $ZrO_2$, $Al_2O_3$, AlN, $TiO_2$, $La_2O_3$, $Y_2O_3$, $Gd_2O_3$, $Ta_2O_5$ or a combination thereof, for example. The method of forming the high-k material layer 106 includes performing a CVD process, for example. In an embodiment, an insulation material layer 104 is optionally formed on the substrate 100 before the step of forming the high-k layer 106, so as to increase the adhesion between the high-k layer 106 and the substrate 100. The insulation material layer 104 includes silicon oxide, and the forming method thereof includes performing a thermal oxide process, for example.

Afterwards, a work function metal material layer 108 is formed on the high-k material layer 106. The work function metal material layer 108 includes TiN, TaC, TaCNO, TaCN, $TiAl_x$ or TaN, for example. The work function metal material layer 108 includes a material of the desired work function value, and is not limited by the above-mentioned materials. The desired work function value of the work function metal material layer 108 is about 4.1 eV in an NMOS area and about 5.1 eV in a PMOS area. The method of forming the work function metal material layer 108 includes performing a CVD process or a physical chemical vapor (PVD) process, for example. In an embodiment, when the first area 102 is an NMOS area, the work function metal material layer 108 includes $TiAl_x$. In another embodiment, when the first area 102 is a PMOS area, the work function metal material layer 108 includes TiN.

Further, a middle material layer 110 is optionally formed on the work function metal material layer 108. The middle material layer 110 and the work function metal material layer 108 include different materials. The middle material layer 110 includes Ti rich TiN or Ti rich $TiN_x$, for example. The middle material layer 110 is for adjusting the work function value of the work function metal material layer 108. The method of forming the middle material layer 110 includes performing a CVD process or a PVD process, for example.

Specially, the middle material layer 110 is suitable for a CMOS transistor process. In an embodiment, the substrate 100 further includes a second area (not shown), the first area 102 is an NMOS area and the second area is a PMOS area. The work function metal material layer 108 including TiN is formed over the substrate 100 in the first area 102 and the second area, and the work function metal material layer 108 provides the required work function value for the PMOS area (i.e. the second area). Thereafter, the middle material layer 110 including Ti rich $TiAl_x$ is formed on the work function metal material layer 108 in the first area 102, and Al atoms of the middle material layer 110 are doped to the work function metal material layer 108 thereunder, so as to increase the work function value of the work function metal material layer 108 in the first area and further provide the required work function value for the NMOS area (i.e. the first area).

In another embodiment, the substrate 100 further includes a second area (not shown), the first area 102 is a PMOS area and the second area is an NMOS area. The work function metal material layer 108 including $TiAl_x$ is formed over the substrate 100 in the first area 102 and the second area, and the work function metal material layer 108 provides the required work function value in the NMOS area (i.e. the second area). Thereafter, the middle material layer 110 including Ti rich TiN is formed on the work function metal material layer 108 in the first area 102, and N atoms of the middle material layer 110 are doped to the work function metal material layer 108 thereunder, so as to decrease the work function value of the work function metal material layer 108 in the first area and further provide the required work function value for the PMOS area (i.e. the first area).

In other words, the work function metal material layer 108 is formed over the substrate 100 in the NMOS area and the PMOS area, so as to obtain the work function value for one of the NMOS area and the PMOS area. Thereafter, the middle material layer 110, having a different material from the work function metal material layer 108, is formed on the work function metal material layer 108 in the other of the NMOS area and the PMOS area, so as to adjust the work function value for the other of the NMOS area and the PMOS area. Consequently, the work function values for both NMOS and PMOS areas meet the standards.

Next, the substrate 100 including the first area 102 is illustrated as an exemplary example in the following.

Thereafter, a wetting material layer 112, a polysilicon material layer 114, a mask material layer 116 and a patterned photoresist layer 118 are sequentially formed on the middle material layer 110. The wetting material layer 112 is a metal layer which can form a bonding to the subsequently formed metal layer 132 (see FIG. 1E), and the material thereof includes Ti, $TiAl_x$, Ti rich TiN, Al or a combination thereof, for example. The method of forming the wetting material layer 112 includes performing a CVD process or a PVD process, for example. The mask material layer 116 includes silicon oxide, silicon nitride or silicon oxynitride, for example. The method of forming the polysilicon material layer 114 and the mask material layer 116 includes performing a CVD process, for example.

Figure 1B:
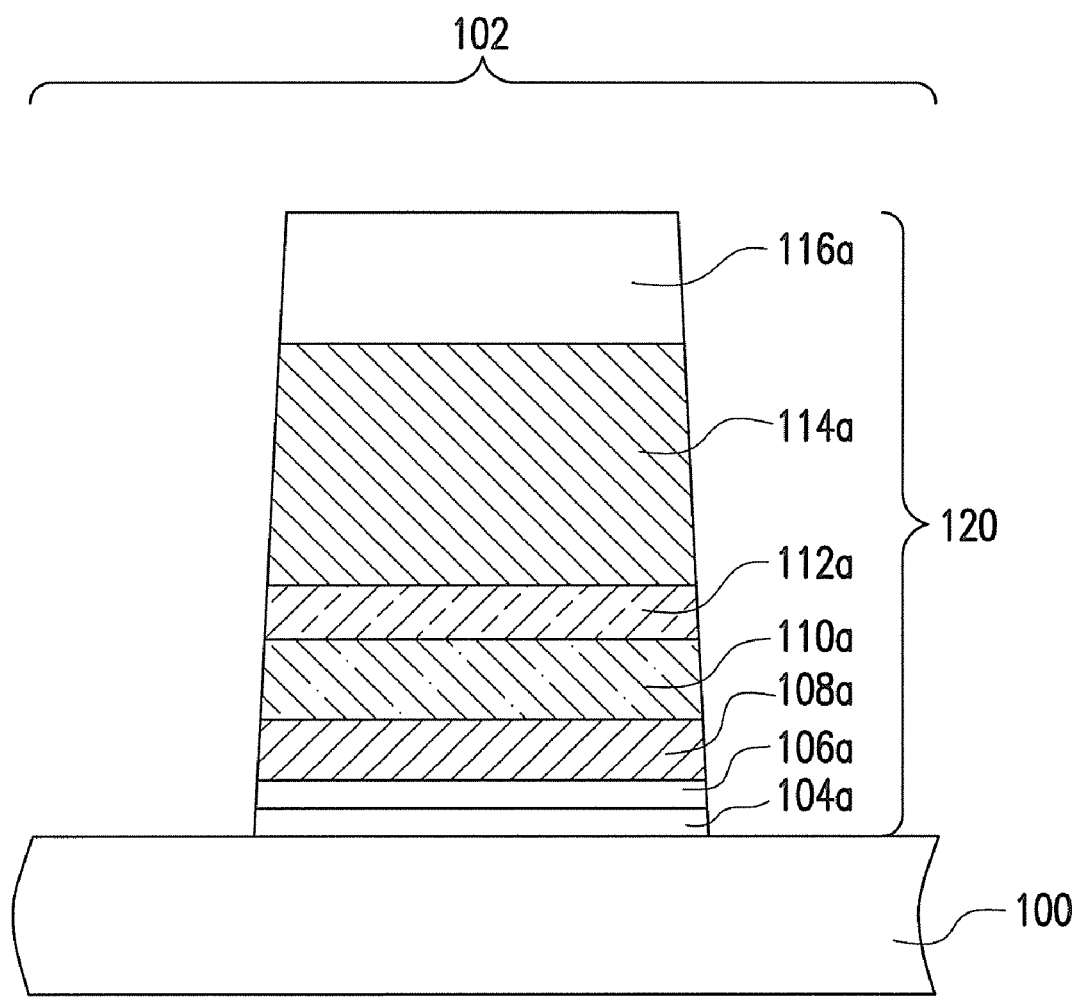

Referring to FIG. 1B, the mask material layer 116, the polysilicon material layer 114, the wetting material layer 112, the middle material layer 110, the work function metal material layer 108, the high-k material layer 106 and the insulation material layer 104 are sequentially patterned, using the patterned photoresist layer 118 as a mask, so as to form a gate structure 120. The gate structure 120 includes an insulation layer 104a, a high-k layer 106a, a work function metal layer 108a, a middle layer 110a, a wetting layer 112a, a polysilicon layer 114a and a mask layer 116a sequentially formed on the substrate 100. The patterning method includes performing an etching process, for example. Due to the limitation of the etching process during the patterning step, the gate structure 120 is shaped as a trapezoid with a bottom wider than a top, and the sidewall thereof and the substrate 100 form an inner included angle of less than 90 degrees.

Figure 1C:
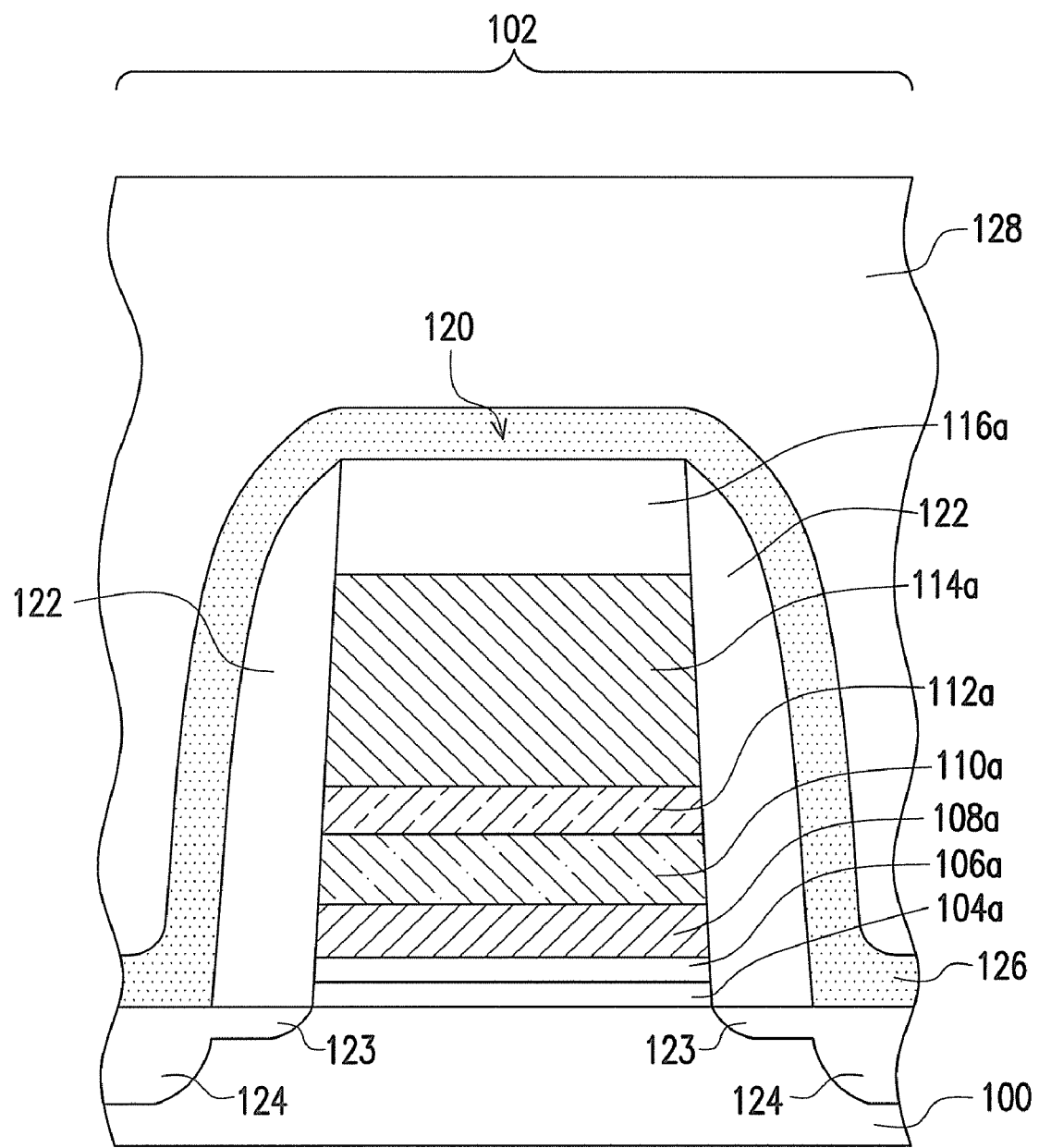

Referring to FIG. 1C, an ion implantation process is performed, using the gate structure 120 as a mask, so as to form light doped regions 123 in the substrate 100 beside the gate structure 120. When the first area 102 is an NMOS area, the lightly doped regions 123 are N-type lightly doped regions.

When the first area 102 is a PMOS area, the lightly doped regions 123 are P-type lightly doped regions. Thereafter, a spacer 122 is formed on the sidewall of the gate structure 120. The spacer 122 includes silicon oxide, silicon nitride or silicon oxynitride, for example. The method of forming the spacer 122 includes forming a spacer material layer (not shown) on the substrate 100 by a CVD process, and then removing a portion of the spacer material layer by an anisotropic etching process. The spacer 122 can be a single-layer or a multiple-layer structure, and only a single layer structure is shown in FIG. 1C.

Afterwards, source/drain regions 124 are formed in the substrate 100 beside the gate structure 120. In an embodiment, the method of forming the source/drain regions 124 includes performing an ion implantation process, for example. When the first area 102 is an NMOS area, the source/drain regions 124 are N-type heavily doped regions. When the first area 102 is a PMOS area, the source/drain regions 124 are P-type heavily doped regions. In another embodiment, the method of forming the source/drain regions 124 includes removing a portion of the substrate 100 beside the gate structure 120 to form trenches (not shown), and then performing a selective epitaxial growth (SEG) process. When the first area 102 is an NMOS area, the source/drain regions 124 are SiC epitaxial layers. When the first area 102 is a PMOS area, the source/drain regions 124 are SiGe epitaxial layers.

Further, an interlayer dielectric (ILD) layer 128 is formed over the substrate 100. The ILD layer 128 includes silicon oxide, silicon nitride or silicon oxynitride, and the forming method thereof includes performing a CVD process, for example. In an embodiment, a stress layer 126 is optionally formed over the substrate 100 after the step of forming the source/drain regions 124 and before the step of forming the ILD layer 128. The stress layer 126 includes silicon nitride, and the foaming method thereof includes performing a CVD process, for example. The process parameters for forming the stress layer 126 can be adjusted, so as to produce a tensile stress for the channel of an NMOS transistor, or produce a compressive stress for the channel of a PMOS transistor.

Figure 1D:
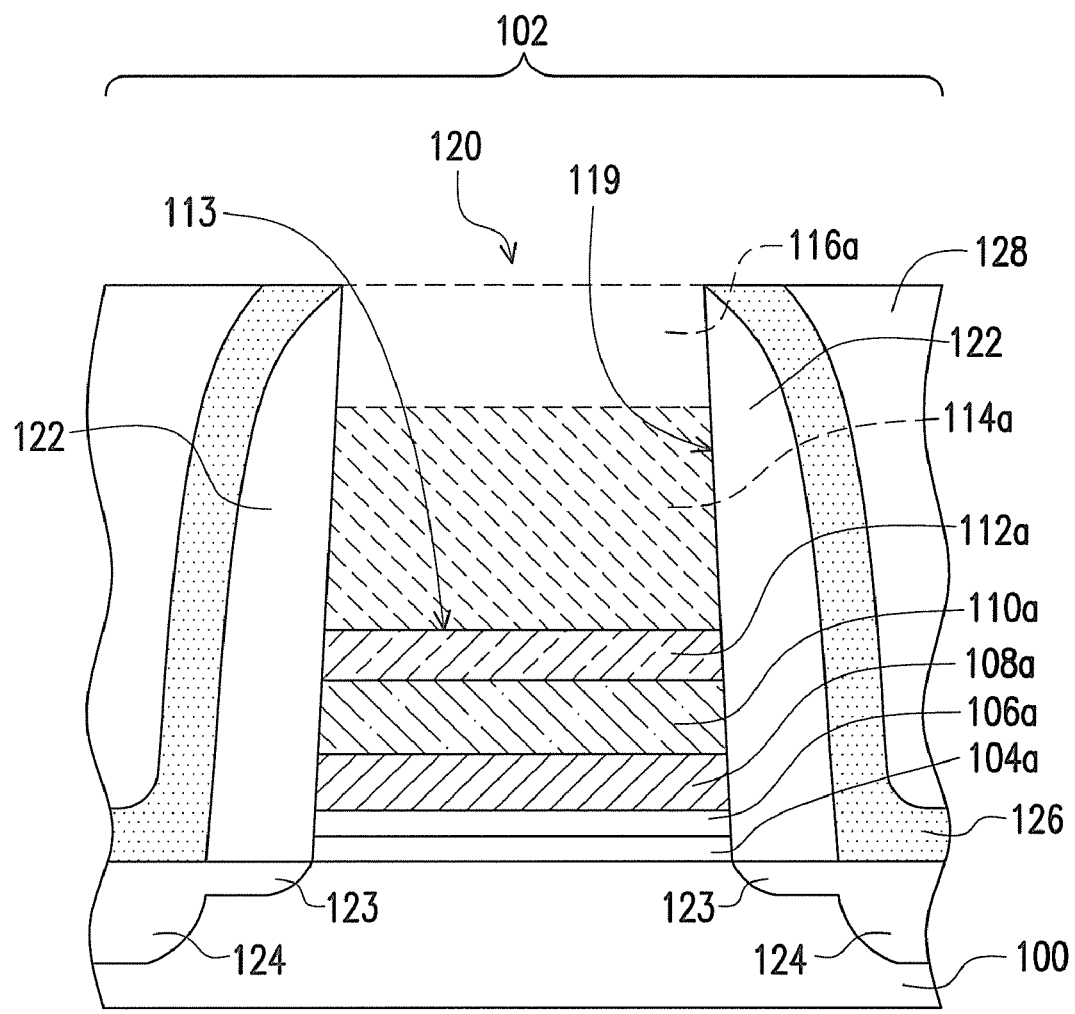

Referring to FIG. 1D, a portion of the ILD layer 128 and a portion of the stress layer 126 are removed, so as to expose the surface of the mask layer 116a. The method of removing the portion of the ILD layer 128 and the portion of the stress layer 126 includes performing a chemical mechanical polishing (CMP) process or an etching back process, for example. Thereafter, the mask layer 116a and the polysilicon layer 114a are sequentially removed, so as to form a trench 119 in the gate structure 120 and expose the surface 113 of the wetting layer 112a. The method of sequentially removing the mask layer 116a and the polysilicon layer 114a includes performing a wet etching process, for example. In this embodiment, since the gate structure 120 is shaped as a trapezoid with a bottom wider than a top, the exposed trench 119 in the gate structure 120 also has the top narrowing property.

Figure 1E:
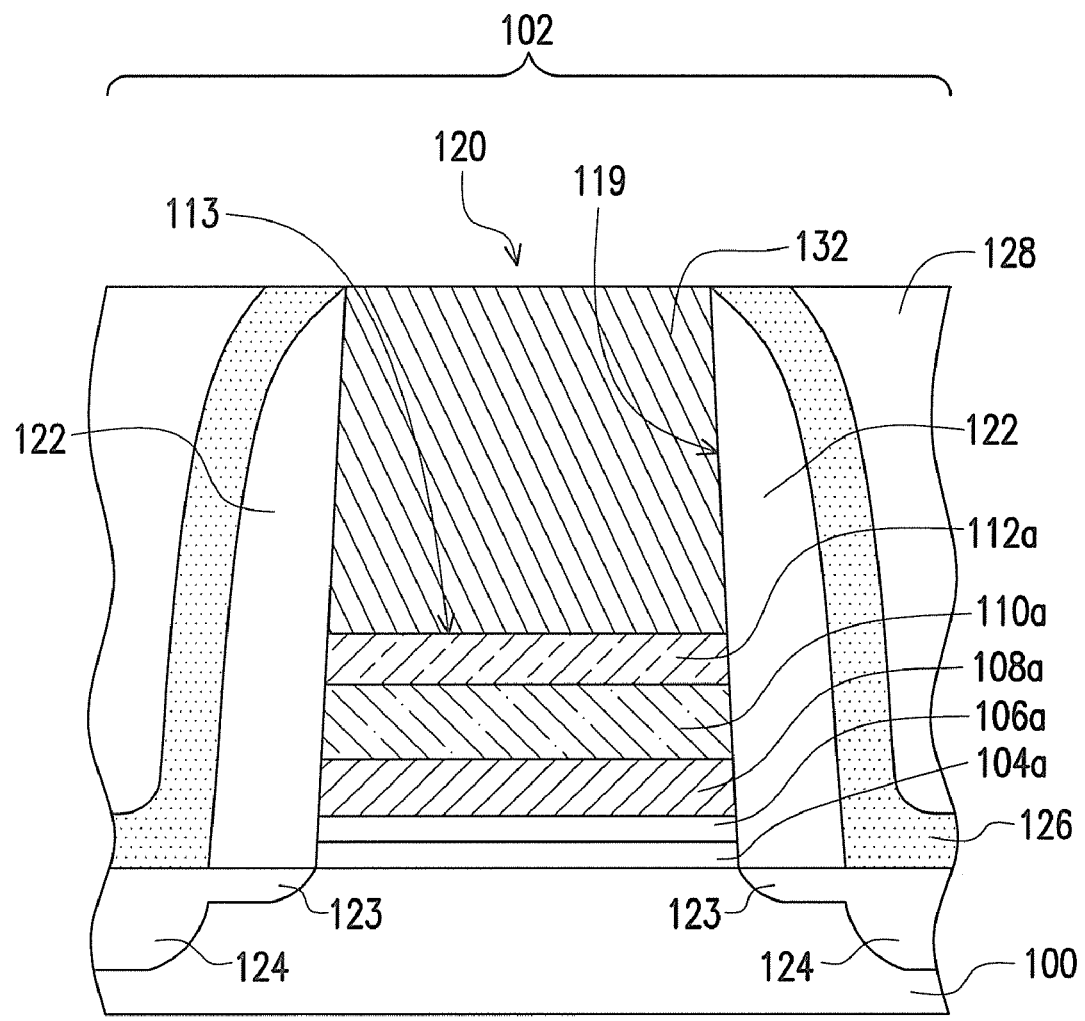
Figure 1E:
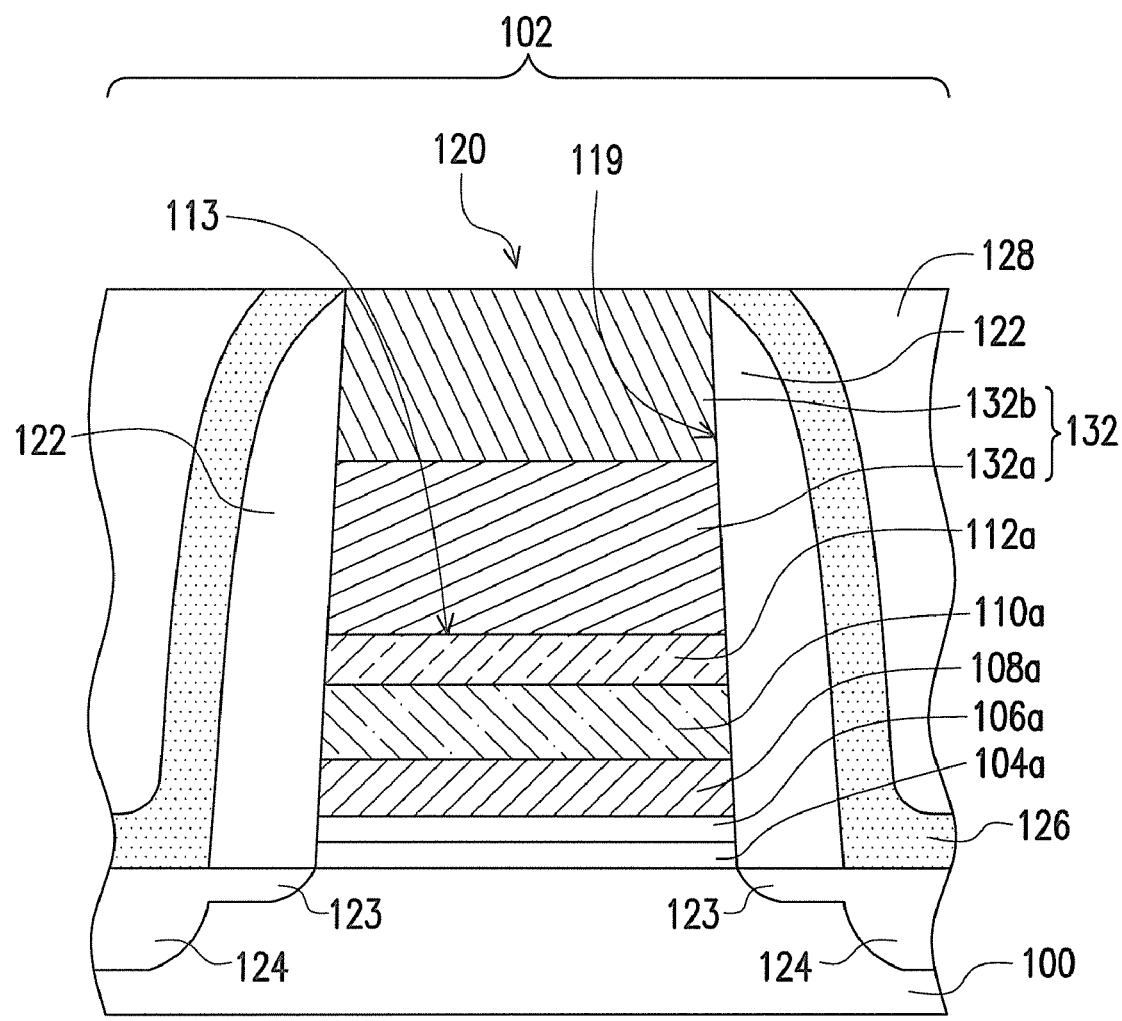

Referring to FIG. 1E, a metal layer 132 is formed on the wetting layer 112a. In an embodiment, the metal layer 132 includes Al, for example. In another embodiment, the metal layer 132 may be selected from the group consisting of TiN, Ti, Ta, TaN, TiC, TaC, TiAl, W, WN, Co, Cu, Ni and combinations thereof, for example. In yet another embodiment, the metal layer 132 is a bi-layer structure including a AlTi layer 132a and a AlTiO layer 132b, as shown in FIG. 1E'. The AlTi layer 132a is under the AlTiO layer 132b, an Al/Ti ratio in the AlTi layer 132a is about 65:35 atom %, and an Al/Ti/O ratio in the AlTiO layer 132b is about 40:10:50 atom %, for example.

In an embodiment, a selective CVD process is performed, so as to bottom-up deposit a metal layer 132 from the surface 113 of the wetting layer 112a. The precursor for performing the selective CVD process includes Alpis-3 ($(BH_4(AlH_2N(CH_3)_3)$), dimethylethylamine alane (DMEAA) or dimethylaluminum hydride (DMAH), for example. The wetting layer 112a serves as a seeding layer, and Al atoms decomposed from the precursor are bonded to the wetting layer 112a, so as to bottom-up deposit the metal layer 132 gradually until the metal layer 132 fills up the trench 119. The reaction mechanism of the selective CVD Al process only bottom-up deposits aluminum from the surface 113 of the wetting layer 112a without growing aluminum on the sidewall of the trench 119 adjacent to the spacer 122. Therefore, the metal gap fill property is good and voids are not observed.

The semiconductor device of the present invention is illustrated in the following. Referring to FIG. 1E, the semiconductor device of the present invention includes a substrate 100, a gate structure 120, a spacer 122 and source/drain regions 124. The gate structure 120 is on the substrate 100, wherein the gate structure 120 includes, from bottom to top, a high-k layer 106a, a work function metal layer 108a, a wetting layer 112a and a metal layer 132. The spacer 122 is on a sidewall of the gate structure 120. The source/drain regions 124 are in the substrate 100 beside the gate structure 120.

The semiconductor device of the present invention can further includes an insulation layer 104a, a middle layer 110a and a stress layer 126. The insulation layer 104a is disposed between the substrate 100 and the high-k layer 106a. The middle layer 110a is disposed between the work function metal layer 108a and the wetting layer 112a. The stress layer 126 is disposed on a sidewall of the spacer 122.

In an embodiment, the metal layer 132 is a single-layer structure, as shown in FIG. 1E. In another embodiment, the metal layer 132 can be a bi-layer structure including a AlTi layer 132a and a AlTiO layer 132b, as shown in FIG. 1E'. The AlTi layer 132a is under the AlTiO layer 132b, an Al/Ti ratio in the AlTi layer 132a is about 65:35 atom %, and an Al/Ti/O ratio in the AlTiO layer 132b is about 40:10:50 atom %, for example. However, the present invention is not limited thereto. Persons skilled in the art should appreciate that the metal layer 132 can be designed as a multiple-layer structure upon the requirements.

In summary, according to the method of the present invention, the wetting layer is formed before the polysilicon layer is formed, so that after the trapezoid gate structure is formed and the polysilicon layer is removed, the wetting layer can serve as a seeding layer for the following selective CVD Al process, so as to bottom-up deposit aluminum from the surface of the wetting layer without producing voids. Compared to the conventional Al sputtering process, the selective CVD Al process of the present invention has good metal gap fill property without producing voids, so that the reliability and performance of the device are accordingly enhanced.

Besides, in the semiconductor device of the present invention, the wetting layer is disposed below the metal layer, so that the metal layer can grow as a void-free metal layer. The semiconductor device having a void-free metal gate can provide a higher reliability and accordingly meet the customer's requirement.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A semiconductor device, comprising:
a substrate;
a gate structure on the substrate, wherein the gate structure comprises, from bottom to top, a high-k layer, a work function metal layer, a wetting metal layer and a metal layer, and the metal layer is a bi-layer structure comprising a AlTi layer and a AlTiO layer;
a spacer on a sidewall of the gate structure; and
source/drain regions in the substrate beside the gate structure.

2. The semiconductor device of claim 1, wherein the gate structure further comprises an insulation layer formed between the substrate and the high-k layer.

3. The semiconductor device of claim 1, wherein the metal layer comprises Al.

4. The semiconductor device of claim 1, wherein the metal layer is selected from the group consisting of TiN, Ti, Ta, TaN, TiC, TaC, TiAl, W, WN, Co, Cu, Ni and combinations thereof.

5. The semiconductor device of claim 1, wherein the AlTi layer is under the AlTiO layer.

6. The semiconductor device of claim 5, wherein an Al/Ti ratio in the AlTi layer is 65:35 atom %.

7. The semiconductor device of claim 5, wherein an Al/Ti/O ratio in the AlTiO layer is 40:10:50 atom %.

8. The semiconductor device of claim 1, wherein the wetting metal layer comprises Ti, $TiAl_x$, Ti rich TiN, Al or a combination thereof.

9. The semiconductor device of claim 1, wherein the wetting metal layer is formed by a physical vapor deposition (PVD) process.

10. The semiconductor device of claim 1, wherein the work function metal layer comprises TiN, TaC, TaCNO, TaCN, $TiAl_x$ or TaN.

11. The semiconductor device of claim 1, wherein the gate structure further comprises a middle layer formed between the work function metal layer and the wetting metal layer.

12. The semiconductor device of claim 11, wherein the middle layer and the work function metal layer comprise different materials.

13. The semiconductor device of claim 12, wherein the middle layer comprises Ti rich TiN or Ti rich $TiAl_x$.

14. The semiconductor device of claim 11, wherein the middle layer is for adjusting a work function value of the work function metal layer.

15. The semiconductor device of claim 1, wherein the high-k layer comprises $HfO_2$, $ZrO_2$, $Al_2O_3$, AlN, $TiO_2$, $La_2O_3$, $Y_2O_3$, $Gd_2O_3$, $Ta_2O_5$ or a combination thereof.

16. The semiconductor device of claim 1, further comprising a stress layer on a sidewall of the spacer.

17. The semiconductor device of claim 16, wherein the stress layer comprises silicon nitride.

18. The semiconductor device of claim 1, wherein the source/drain regions are doped regions.

19. The semiconductor device of claim 1, wherein the source/drain regions are epitaxial layers.

* * * * *